United States Patent [19]
Gabet et al.

[11] Patent Number: 6,075,474
[45] Date of Patent: Jun. 13, 2000

[54] DEVICE FOR THE GENERATION OF ANALOG SIGNALS THROUGH DIGITAL-ANALOG CONVERTERS, ESPECIALLY FOR DIRECT DIGITAL SYNTHESIS

[75] Inventors: Pascal Gabet, Chaville; Jean-Luc De Gouy, Briis sous Forges, both of France

[73] Assignee: Thomson-CSF, Paris, France

[21] Appl. No.: 09/105,172

[22] Filed: Jun. 26, 1998

[30] Foreign Application Priority Data

Jun. 27, 1997 [FR] France ................................ 97 08139

[51] Int. Cl.[7] .............................. H03M 3/00; H03M 1/10
[52] U.S. Cl. ............................................ 341/143; 341/120
[58] Field of Search .................................. 341/143, 144, 341/147, 120, 139; 327/105

[56] References Cited

U.S. PATENT DOCUMENTS

| | | | |
|---|---|---|---|
| 5,554,987 | 9/1996 | Ooga | 341/147 |
| 5,563,535 | 10/1996 | Corry et al. | 327/105 |
| 5,574,455 | 11/1996 | Hori et al. | 341/144 |

FOREIGN PATENT DOCUMENTS

| | | |
|---|---|---|
| 0 660 532 | 6/1995 | European Pat. Off. . |
| WO 91/04611 | 4/1991 | WIPO . |
| WO 96/17287 | 6/1996 | WIPO . |

OTHER PUBLICATIONS

Paul O'Leary, et al., "An Oversampling–Based DTMF Generator," IEEE Transactions On Communications, vol. 39, No. 8, Aug. (1991), pp. 1189–1191.

*Primary Examiner*—Brian Young
*Assistant Examiner*—Patrick Wamsley
*Attorney, Agent, or Firm*—Oblon, Spivak, McClelland, Maier & Neustadt, P.C.

[57] ABSTRACT

A device for the generation of analog signals by means of analog-digital converters comprises a block for the generation of words encoded on N bits and an analog-digital converter whose input is encoded on M bits, M being smaller than N. The device furthermore comprises a sigma-delta modulator, at the output of the first block, the bus being separated into M most significant bits reserved for the input of the analog-digital converter and N–M least significant bits that enter the sigma-delta modulator, the output of this modulator being an M-bit bus that is added to the M output bits of the word generation block by digital addition means, M being smaller than N.

6 Claims, 7 Drawing Sheets

DEVICE FOR THE GENERATION OF ANALOG SIGNALS THROUGH DIGITAL-ANALOG CONVERTERS, ESPECIALLY FOR DIRECT DIGITAL SYNTHESIS

BACKGROUND OF THE INVENTION

1. Field of the Invention

The present invention relates to a device for the generation of analog signals by means of analog-digital converters. It can be applied especially to the field of the direct digital synthesis. More generally, it can be applied to the generation of analog signals starting from digital-analog converters where, for example, it is necessary to reduce the effect of nonlinearity of these converters.

2. Description of the Prior Art

Direct digital synthesis is a technique of frequency synthesis wherein the samples of the sinusoidal signal to be generated are prepared in digital mode and these samples are converted into analog form by means of a digital-analog converter, hereinafter called a DAC. The frequency synthesizers obtained by this technique are highly attractive in terms of volume, weight and energy consumption for they can benefit from large-scale integration. Their other advantages are in particular very high resolution and very small switching times.

One drawback of direct digital synthesizers according to the prior art is that the spectrum of the output signal shows many parasitic lines. Indeed, at the input of the DAC of the synthesizer, the amplitude of the signal is encoded on a number of bits M which is generally smaller than the number of bits N of the digital signal prepared. The passage from N bits to M bits generates an error of quantification or truncation that results in the presence of parasitic lines on the output signal.

In addition, because of the above-mentioned quantification, the transfer function of the DAC, i.e. the output voltage as a function of the input digital words, is a stepped function. These non-linearities then designate the fact then that the steps are not of equal heights. These non-linearities are added to the above mentioned errors of quantification, and are thus defects of the transfer function as compared with an ideal transfer function where the steps would have the same height. The non-linearities of the DAC result in the generation of harmonic frequencies which are aliased owing to the sampling. In other words, parasitic lines are thus created, a parasitic line being a spectral component located at frequencies different from that of the fundamental component of the signal to be synthesized.

According to a known method for eliminating the amplitude quantification and reducing the non-linearities of a DAC, a high amplitude random noise is added to the prepared digital signal, present at the input of the DAC. This random noise is then removed in an analog manner by a second DAC. This method is described for example in the European patent application EP 0452031. The disadvantage of this method is that it lowers the performance characteristics of the phase noise of a direct digital synthesizer especially because of the injection of noise and the difficulty in matching the two DACs.

SUMMARY OF THE INVENTION

The goal of the invention in particular is to improve the spectral purity of direct digital synthesizers by reducing the level of the parasitic lines, in doing so without lowering the noise performance characteristics. To this end, an object of the invention is an analog signal generation device comprising a block for the generation of words encoded on N bits and an analog-digital converter whose input is encoded on M bits, M being smaller than N, the device furthermore comprising a sigma-delta modulator, at the output of the first block, the bus being separated into M most significant bits reserved for the input of the analog-digital converter and N–M least significant bits that enter the sigma-delta modulator, the output of this modulator being an M-bit bus that is added to the M output bits of the word generation block by digital addition means, the result of the addition constituting the input signal of the analog-digital converter.

The main advantages of the invention are that it minimizes the increase in the basic level of the phase noise of a digital synthesizer, can be adapted to all kinds of systems for the generation of analog signals from analog-digital converters and is compact, simple to implement and economical.

BRIEF DESCRIPTION OF THE DRAWINGS

Other features and advantages of the invention shall appear from the following description made with reference to the appended drawings of which.

MORE DETAILED DESCRIPTION

The invention is described with reference to direct digital synthesizers. However, it can be applied to other types of devices for the generation of signals from digital data.

Figure 1:
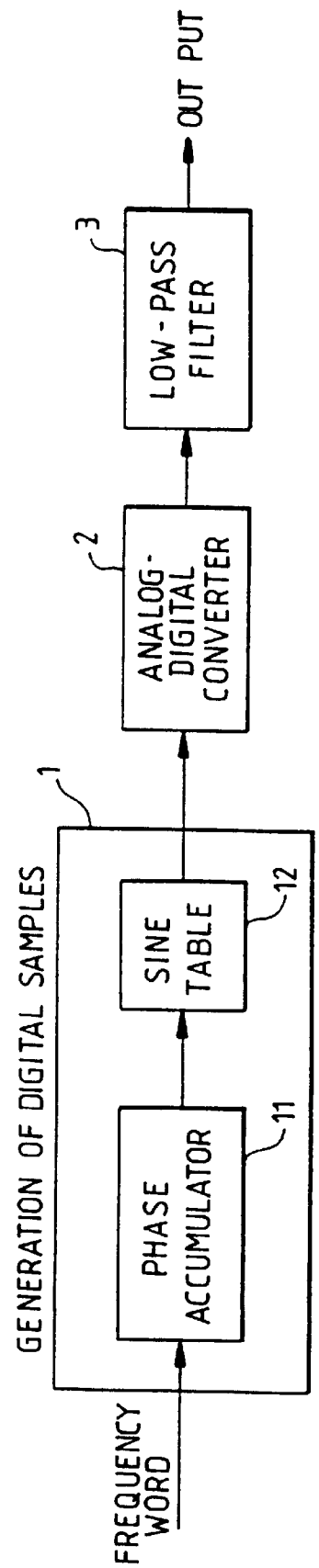
FIG. 1 is a block diagram of an exemplary embodiment of a prior art device.

FIG. 1 is a block diagram of a direct digital synthesizer according to the prior art. This synthesizer comprises for example three main blocks 1, 2, 3. A block 1 for the generation of digital samples of the sinusoidal signal to be synthesized receives a digital word for frequency control and a clock signal. Conventionally, this block 1 comprises a phase accumulator 11 and a memory 12 containing the sine function. The phase accumulator 11 comprises for example a digitized ramp generator connected to the address bus of the memory 12 containing the sine function. The output of this first block 1 is connected to the input of a block 2 for the conversion of the digital samples delivered by this first block 1 into an analog signal. The DAC is contained in this block 2 or constitutes it. The output of this second block 2 is connected to the input of a low-pass filtering block 3 which makes it possible for example to eliminate the spectral components related to the sampling. This third block 3 delivers the output analog signal of the synthesizer. As indicated previously, a major disadvantage of this direct digital synthesizer is that the spectrum of the output signal has many parasitic lines. They are due in particular to two main causes pertaining to the process of digital-analog conversion described previously. A first cause is the quantification of the amplitude and a second cause is the non-linearity of the DAC used.

Figure 2:
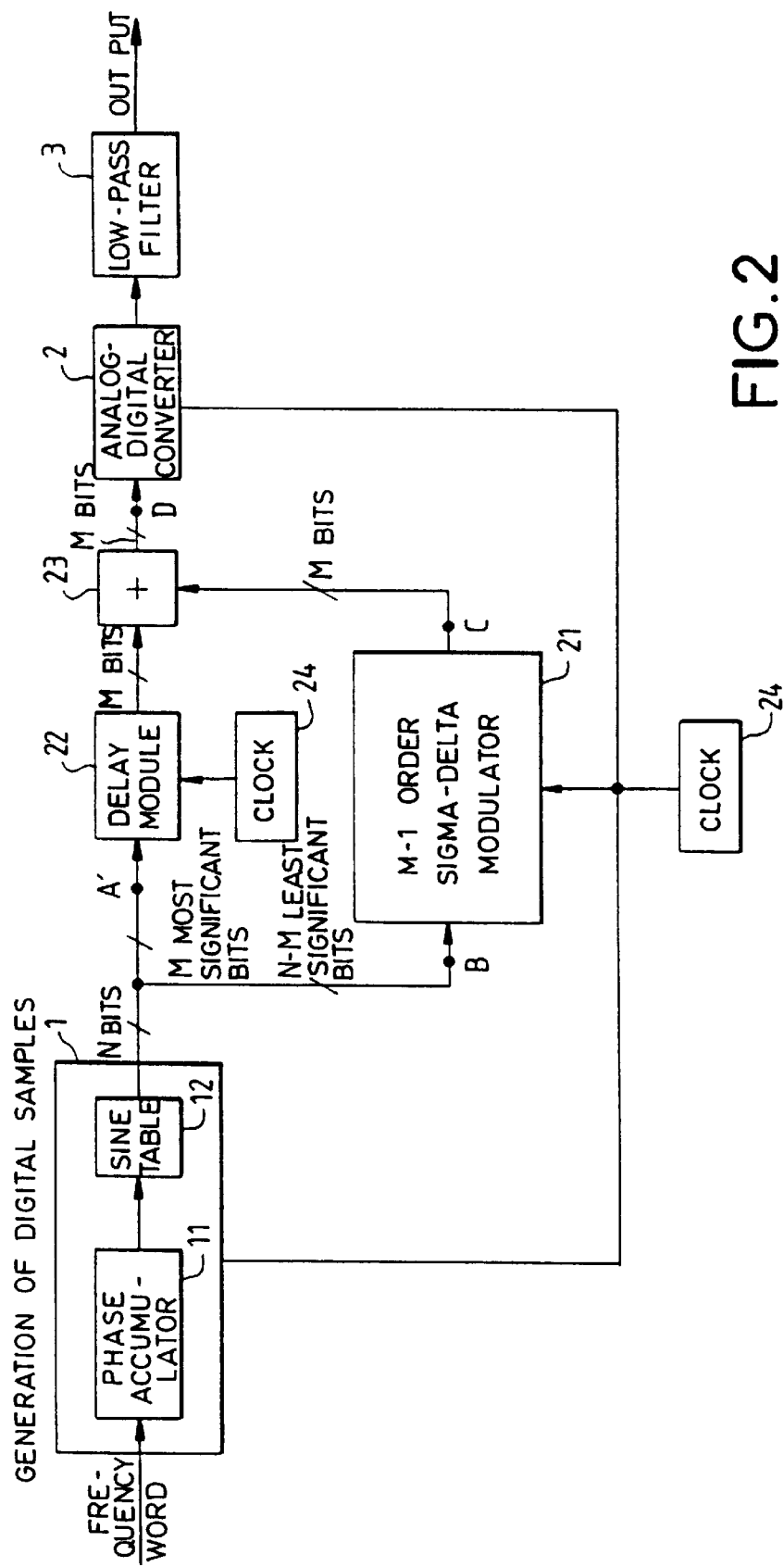
FIG. 2 is a block diagram of an exemplary embodiment of a device according to the invention.

FIG. 2 is a block diagram of an exemplary embodiment of a direct digital synthesizer according to the invention. A sigma-delta modulator 21 is interposed between the block 1 for the generation of the digital samples or for the generation of the words to be converted, and the digital-analog conversion block 2. There is a known way of using a modulator of this kind to pass from an N-bit word to an M-bit word, M being smaller than N, by eliminating the truncation error in the useful signal band, which is the band in which the sine signal or another signal is synthesized. The spectral components related to this truncation are then rejected from this band. According to the invention, a high-order sigma-delta modulator is used not only to cancel the quantification error but also to greatly reduce the effects of non-linearity of the DAC. Thus, according to the invention, the sigma-delta modulator is used above all to solve the problem of non-linearity, and advantageously it also eliminates the truncation errors.

At the output of the first block 1, the bus is separated into M most significant bits that enter for example a delay module 22, and N-M least significant bits that enter the sigma-delta modulator 21. The output of this modulator is an M-bit added to the M output bits of the delay module 22 by digital addition means 23. The delay created by the delay module 22 corresponds to the time taken by the sigma-delta modulator to process a word between its input and its output. The result of the addition constitutes the input signal of the digital-analog converter 2. The low-pass filter 3 connected for example to the output of this digital-analog converter 2 eliminates the spectral components related to the sampling as well as those generated by the sigma-delta modulator 21. The input signal of this modulator 21 is the error $\epsilon$ made by truncating the word from N bits to M bits. A clock 24 provides for example a clock signal with a frequency $F_0$ common to the modulator 21, the analog-digital converter 2 and the delay module 22. FIGS. 3 to 6 which follow illustrate the role of the sigma-delta modulator. They represent the amplitudes of the lines of the digital signals concerned as a function of the frequency F. With regard to the sigma-delta modulator, the number of bits M at output of the modulator is not related to the number of truncated bits N-M. This especially results from the fact that the invention uses only sigma-delta modulators that generate overflows. It is in particular this overflow mechanism that makes it possible to resolve the problem of the non-linearity of the digital-analog converter.

Figure 3:
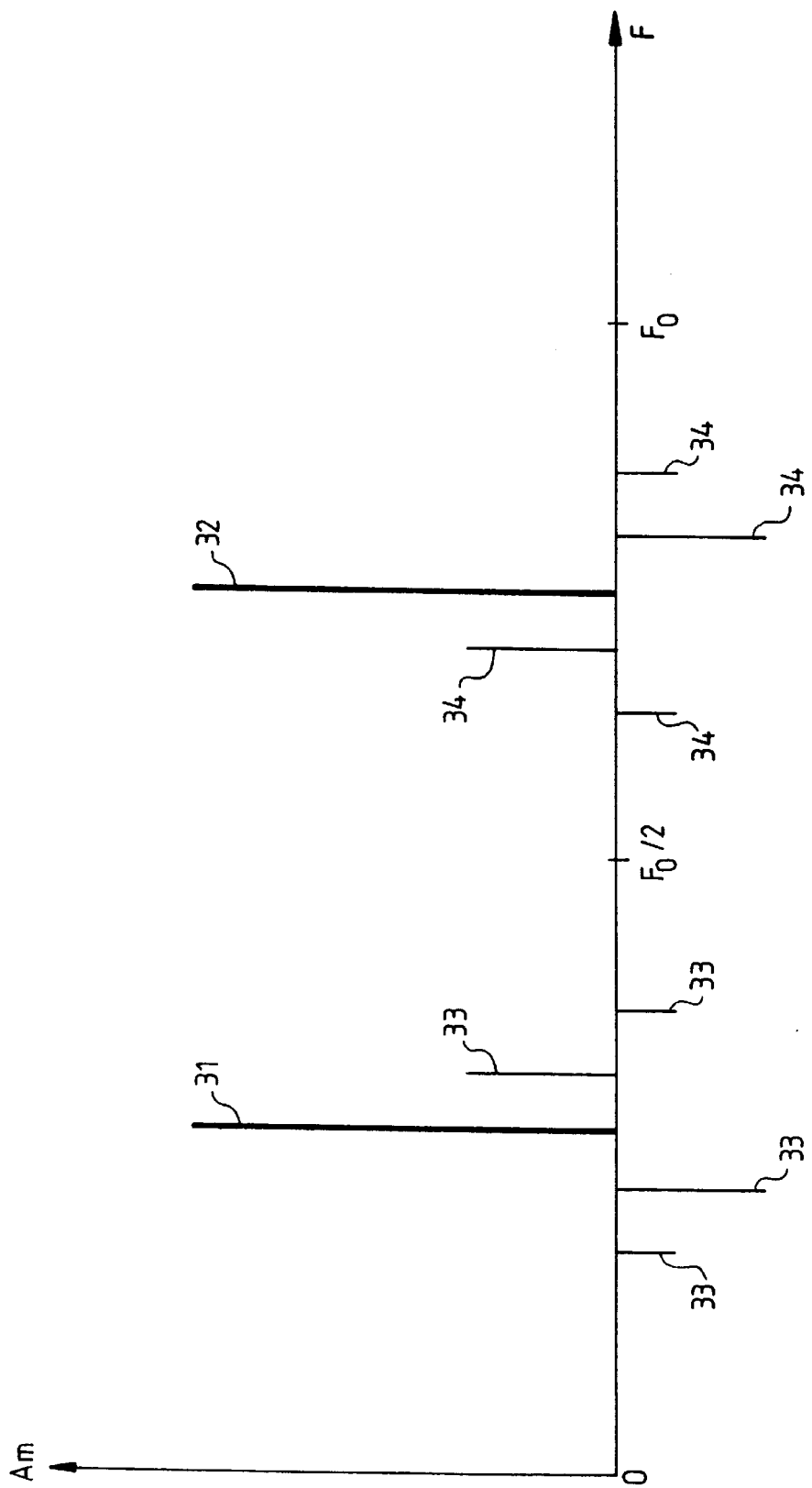
FIGS. 3 to 6 provide an illustration in the frequency domain of the role of a sigma-delta modulator in a device according to the invention.

FIG. 3 illustrates the spectrum of the signal at a point A located at the input of the delay module 22. More specifically, it represents the amplitude Am of the spectral components of the signal as a function of the frequency F in an interval ranging between the null frequency o and the clock frequency $F_0$. This signal includes the M most significant bits of the word to be converted. It comprises for example two useful lines 31, 32 corresponding to the signal to be synthesized. In fact, one line 31 is the useful line and the other line 32 is the useful line that is aliased because of the sampling. These lines are symmetrical with respect to half of the clock frequency $F_0$. Parasitic lines 33, 34 correspond to the truncation of the digital signal or word to be converted, this truncation corresponding to the N-M least significant bits of the signal.

Figure 4:
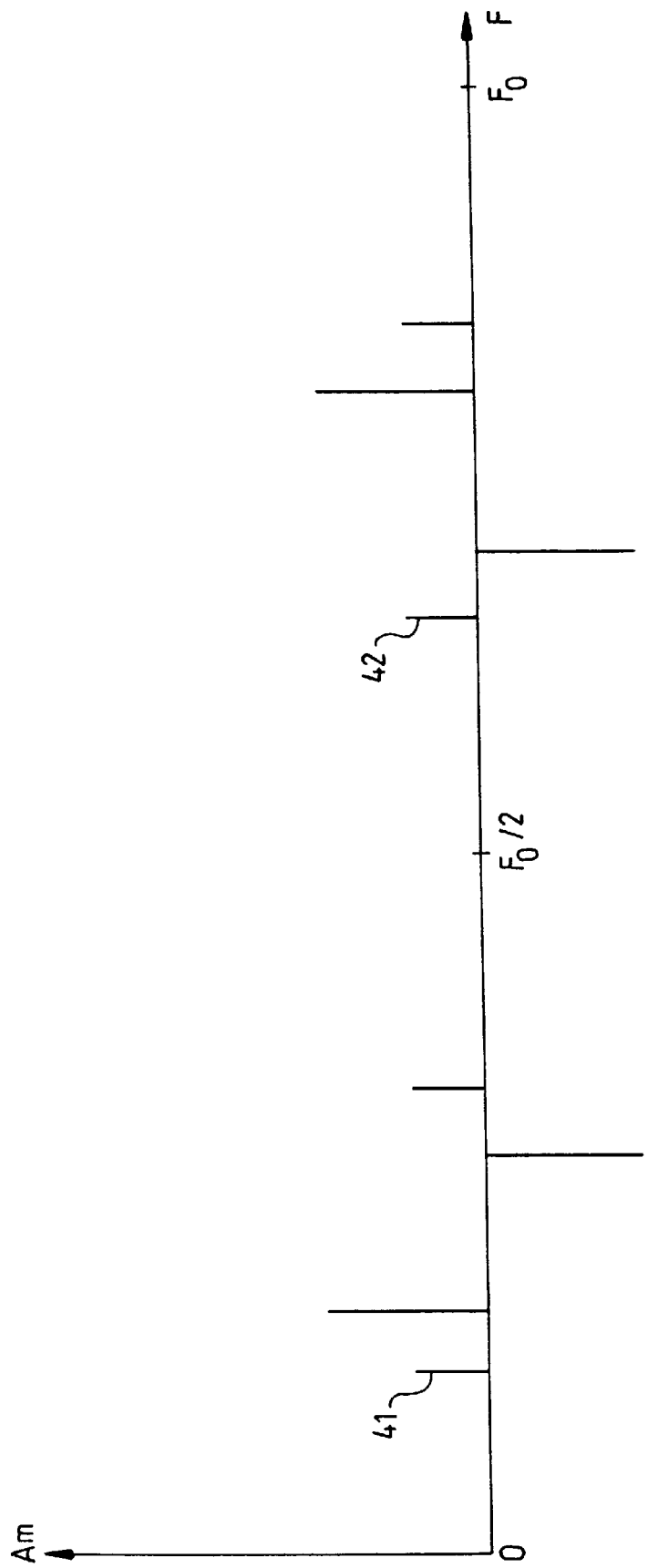

FIG. 4 illustrates the spectrum of the signal at a point B located at the input of the sigma-delta modulator 21. This signal comprises the N-M least significant bits of the word to be converted. The lines 41, 42 of this signal have the same amplitudes as the parasitic lines 33, 34 of the signal at the input A of the delay module 22. They are opposite and are located at the same frequencies.

Figure 5:
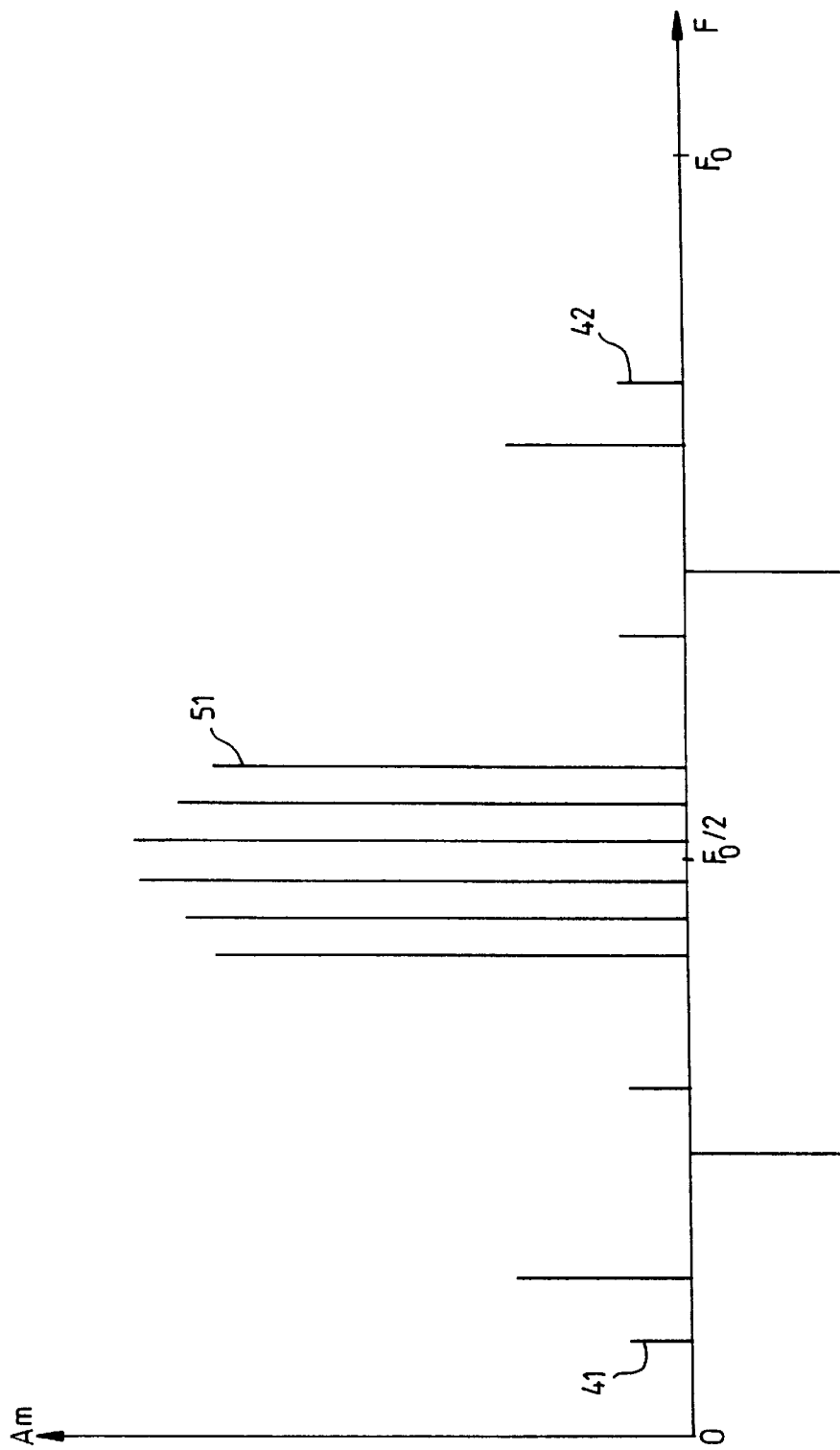

FIG. 5 illustrates the spectrum of the signal at a point C located at output of the sigma-delta modulator 21. The output of this modulator is for example prepared so that it comprises the same number of bits as the signal at the input A of the delay module 22 and so that its expression is the sum of the above mentioned error $\epsilon$ with a digital signal decorrelated from the signal to be synthesize or generated, i.e. in fact decorrelated from the truncated word, represented by the useful lines 31, 32 in FIG. 3. To the lines 41, 42 of the error signal $\epsilon$ there are therefore added lines 51 decorrelated from the useful signal and this error signal $\epsilon$. The term 'decorrelated' means in particular that no correlation function exists between the signals.

Figure 6:
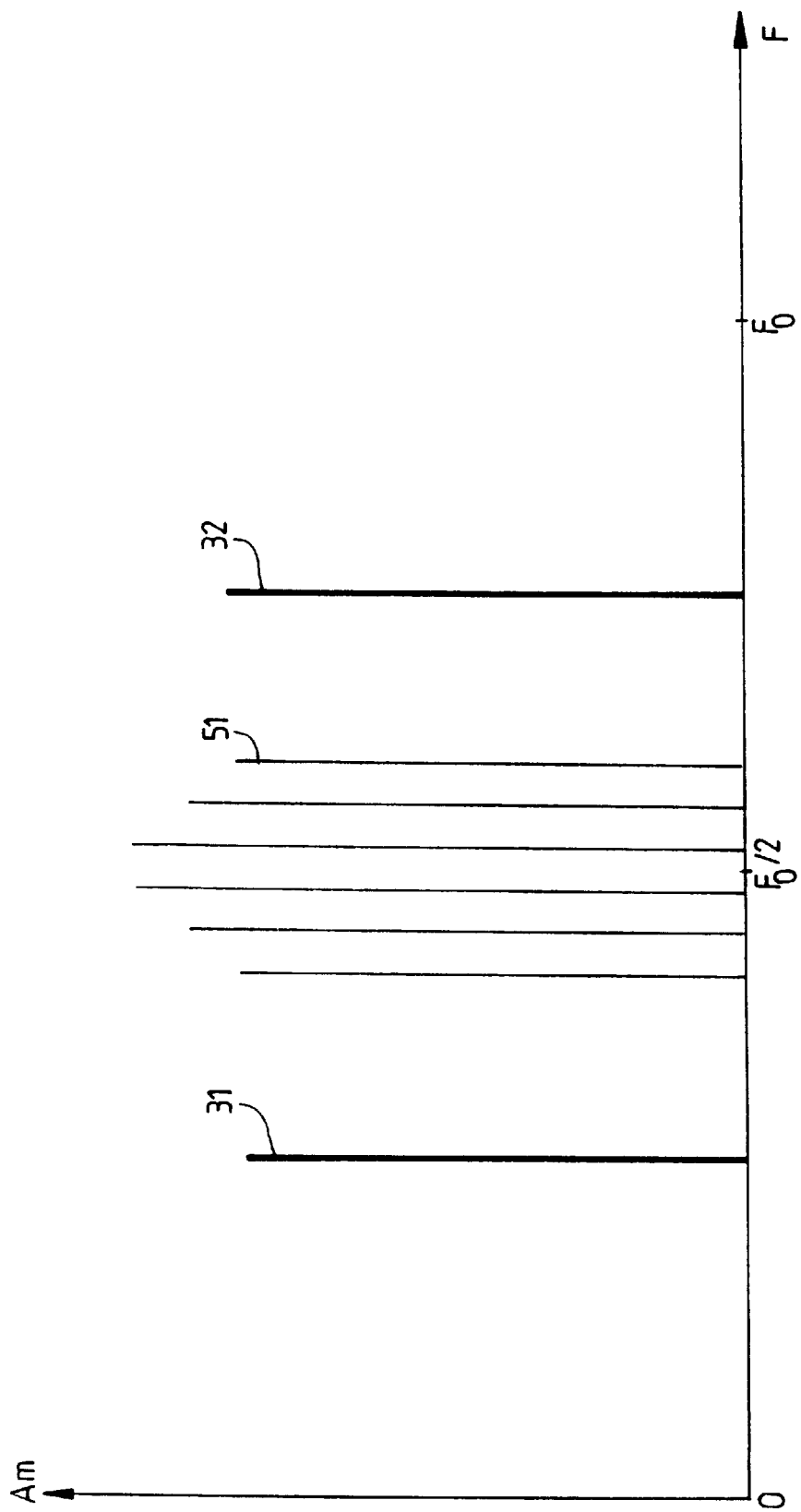

FIG. 6 illustrates the spectrum of the signal at a point D located at the input of the digital-analog converter, therefore after the addition of the signals coming from the delay module 22 and the sigma-delta modulator. The lines 41, 42 of the error signal $\epsilon$ get cancelled out with the parasitic lines 33, 34 of the signal at the input A of the delay module 22. The lines 51 of the decorrelated signal remain in the presence of the useful lines 31, 32. The signal 51 is located in the spectral field outside the band where the useful signals 31, 32 are synthesized, making it possible to eliminate this signal 51 by a filtering operation after the digital-analog conversion, for example by the low-pass filter 3 at output of the digital-analog converter 2.

Preferably, the amplitude of the decorrelated signal 51 is close to that of the useful signal to be synthesized. It may even be higher than that of the useful signal. Thus, for a given value of the output word of the digital sample generation block 1, the signal at input of the digital-analog converter 2 takes up a major part of the operating range of this converter 2. This makes it possible to smoothen its defects of non-linearity and hence significantly reduce the parasitic lines due to these defects, in doing so by eliminating the quantification noise corresponding to the truncation of the signal from N to M bits. The problem of the amplitude quantification and the problem of the non-linearity of the digital-analog converter are thus resolved concomitantly by the device according to the invention, without any introduction of noise.

Indeed, in a preferred embodiment, the output signal of the modulator 21 is expressed by means of an equation on the Z-transforms, the Z-transform of the signal S(z) being given for example by the following relationship:

$$S(z) = z^{-\alpha}\epsilon(z) - Q(1-z^{-1})^{\beta} \qquad (1)$$

$z^{-\alpha}$ represents a delay that is compensated for by the delay module 22, $\beta$ designates the order of the sigma-delta modulator 21. Preferably this order is high, for example equal to M-1, where M is the number of bits of the analog-digital converter 2. A high-order modulator in particular makes it possible to linearize the analog-digital converter by delivering a signal whose energy sweeps through at least half of the range of this converter. $\epsilon(Z)$ represents the z transform of the error signal.

The term $Q(1-z^{-1})^{\beta}$ represents the above-mentioned decorrelated signal 51. This signal for example is located in the spectral domain around the frequency $F_0/2$ where $F_0$ is the frequency of the clock signal 24. It is thus located at a place of the spectrum where the synthesis of a signal with a frequency $F_X$ is generally of no utility because of the difficulty of filtering the frequency aliased by sampling which is equal to $F_0 - F_X$.

Figure 7:
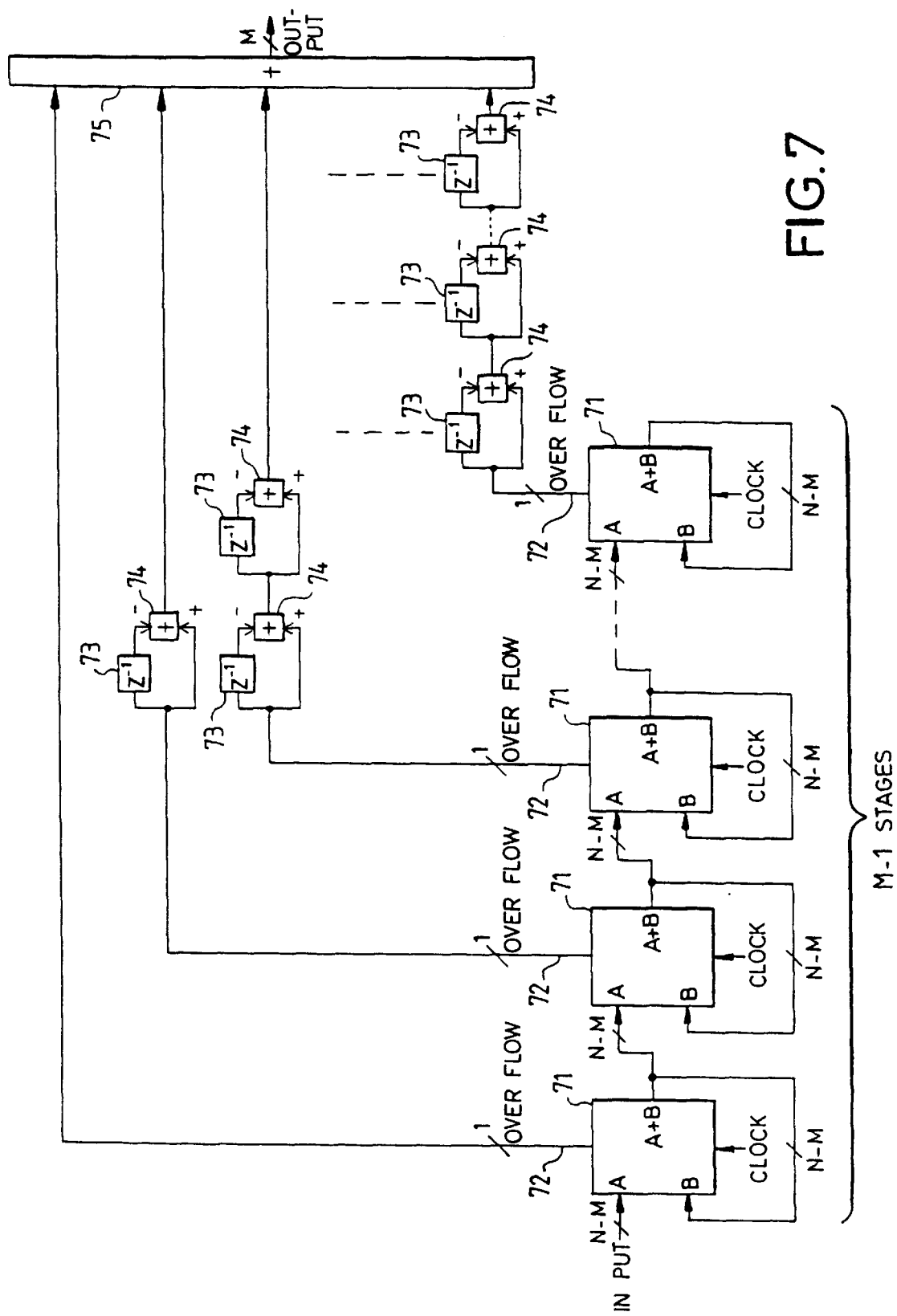
FIG. 7 is a block diagram of an exemplary sigma-delta implanted in a device according to the invention.

FIG. 7 uses a block diagram to illustrate an exemplary sigma-delta modulator 21 that can be implanted in a device according to the invention. With the overflow mechanism, the least significant bit of the output bus of the sigma-delta modulator 21 has the same place value as the least significant bit of the M-bit bus obtained after truncation. The addition of the output of the modulator 21 with the M-bit bus must be done in obtaining a correspondence between the least significant bits. This is the only constraint. Thus, if the bus at output of the modulator is an M-bit bus, the addition with the M-bit bus, resulting from the truncation of the N-bit word, gives at most one M+1 bit bus. In fact, the result of the addition 23 may be an M-bit bus in taking account, in the initial N-bit bus, of the fact that there will be an addition, the amplitudes being managed in the N-bit bus so that the addition is done without overflow.

The sigma-delta modulator 21 is a word of N−M bits. The general role of a sigma-delta modulator is to carry out an encoding of this input signal so that the quantification error, or previously mentioned decorrelated signal, created by the modulator is shaped, i.e. the spectral components related to this quantification error are located outside the band of the useful signals. In the invention, a particular type of sigma-delta modulator that generates overflows is used. In an original way, according to the invention, this phenomenon of overflow is exaggerated to the maximum by taking a high order, equal to M−1, for the sigma-delta modulator in a preferred embodiment. The fact of exaggerating the phenomenon of overflow means that the power of the above-mentioned quantification error is much greater than the power of the input signal of the sigma-delta modulator, in such a way for example that the amplitude of the decorrelated signal 51 is for example greater than that of the useful signal. This operating mode is neither natural nor usual. In particular, it is this strong quantification error that makes it possible to linearize the digital-analog converter.

The sigma-delta modulator 21 according to FIG. 7 is for example formed by M−1 cascade-connected accumulation stages 71, i.e. the input of the P order stage is the output of the P−1 order stage. The number of stages of the modulator corresponds to its order value. Each accumulation stage 71 has an overflow output 72. The overflow outputs 72 are combined with one another by an adder 75, through differentiation stages 73, 74, to give the output signal of the sigma-delta modulator 21 encoded on M bits. A differentiation stage comprises one delay element 73 and one subtractor element 74. The delay element 73, for example based on D type flip-flop circuits, has in particular the function of enabling the synchronization of the operations within the modulator 21. The input of a differentiation stage enters the input of the delay element 73 and the positive input of the subtractor element 74. The output of the delay element enters the negative input of the subtractor element, which deducts the delayed signal from the input signal. An accumulation stage 71 comprises a first input A and a second input B that are encoded on N−M bits and an output A+B, encoded on N−M bits, that presents the addition of the two inputs A, B This output enters, at the same time, the first input A of the following stage and the second output B of its own stage by feedback. The input of the modulator is the first input A of the first stage. For each stage, the overflow bit 72 of the addition A+B enters the input of a first differentiation stage 73, 74 of a sequence of P−1 differentiation stages, P being the order value of the accumulation stage 71. The adder 75 adds the outputs of all the sequences. The overflow bit of the first accumulation stage enters the adder 75 directly. The output of the first differentiation stage of a sequence is −1, 0 or +1. Each differentiation stage 73,74 can double the value of its input. To then take account of the maximum values possible, the output of the adder 75 is encoded on M bits.

The output signal of a modulator as illustrated by FIG. 7 has an amplitude ranging between:

$$2^{N-2}-2^{N-M} \text{ and } 3\times2^{N-2}-2^{N-M}$$

The signal at output of the digital signal generation block 1 for its part is encoded on N bits with an amplitude that is determined in particular so that there is no overflow during its addition 23 with the output signal of the modulator 21. To this end, the signal at output of the sample generation block 1 has an amplitude for example ranging between:

$$2^{N-2}-2^{N-M} \text{ and } 3\times2^{N-2}-2^{N-M}$$

The invention makes it possible to minimize the increase in the noise floor of a synthesizer in the band of the useful signals. Indeed, the increase in the noise is only due to the spreading of the energy of nonlinearity of the digital-analog converter in this band, the quantification energy making no contribution to this increase since the effect of the quantification is removed during the addition of the output signal of the digital sample generation block 1 and the output signal of the sigma-delta modulator 21. So that spreading is done properly, it is preferable that the period of the decorrelated signal 51 should sufficiently long, this period depending in particular on the period of the sequence of the N-bit word delivered by the digital sample generation block 1.

The invention can be adapted to all types of systems for the generation of analog signals from analog-digital converters, whether these signals are sinusoidal signals or not. It is simple to implement inasmuch as it requires only the wiring of some additional elements, among them especially the sigma-delta modulator. For the same reasons, it is compact and economical, the components used being furthermore low cost components.

What is claimed is:

1. An analog signal generation device comprising a block for the generation of words encoded on N bits and a digital-analog converter whose input is encoded on M bits, M being smaller than N, the device furthermore comprising a sigma-delta modulator which generates overflows, a bus at the output of the block, the bus being separated into M most significant bits encoding a useful signal and N−M least significant bits constituting a truncation error, the N−M least significant bits entering the sigma-delta modulator, an output of the modulator being added to the useful signal by digital addition means, a result of the addition constituting an input signal of the digital-analog converter, an order value of the modulator being high so that the amplitude of the output signal of the modulator is close to or greater than that of the useful signal.

2. A device according to claim 1, wherein an expression of the output signal of the sigma-delta modulator is the sum of the truncation error, obtained by truncating a word, with a digital signal decorrelated from the word, and a low-pass filter is connected to an output of the digital-analog converter, this filter eliminating the decorrelated digital signal.

3. A device according to claim 1, wherein the order value of the sigma-delta modulator is equal to M−1.

4. A device according to claim 1, wherein a delay module is interposed between the word generation block and the addition means, the delay created by this module corresponding appreciably to the time taken by the sigma-delta modulator to process a word between its input and its output.

5. A device according to claim 2, wherein the amplitude of the decorrelated digital signal is close to that of a word.

6. A device according claim 1, constituting a direct digital synthesizer.

* * * * *